(12) United States Patent
Ker et al.

(10) Patent No.: US 6,566,715 B1
(45) Date of Patent: May 20, 2003

(54) SUBSTRATE-TRIGGERED TECHNIQUE FOR ON-CHIP ESD PROTECTION CIRCUIT

(75) Inventors: Ming-Dou Ker, Hsinchu (TW); Tung-Yang Chen, Hsinchu (TW); Hun-Hsien Chang, Taipei Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 319 days.

(21) Appl. No.: 09/659,923

(22) Filed: Sep. 12, 2000

(30) Foreign Application Priority Data

Aug. 8, 2000 (TW) ........................................ 89115917 A

(51) Int. Cl.$^7$ .............................................. H01L 23/62
(52) U.S. Cl. ........................ 257/355; 257/360; 257/361; 257/362
(58) Field of Search ................................. 257/355–358, 257/360–363; 361/56

(56) References Cited

U.S. PATENT DOCUMENTS 5,744,842 A * 4/1998 Ker ............................ 257/362
6,072,219 A * 6/2000 Ker et al. .................... 257/355

* cited by examiner

Primary Examiner—Minh Loan Tran

(57) ABSTRACT

In this invention, a novel substrate-triggered technique is proposed to effectively improve the electrostatic discharge (ESD) robustness of integrated circuit (IC) products. The ESD protection circuit derived from the substrate-triggered technique is comprised of a metal-oxide-semiconductor (MOS) transistor and an ESD detection circuit. The MOS transistor is composed of a bulk region, a gate, a source region coupled to a power rail, and a drain region couple to a pad. The source region, the bulk region and the drain region further construct a parasitic bipolar junction transistor (BJT) The ESD detection circuit is located between, and connected to, the power rail and the pad. During normal operation, the ESD detection circuit maintains the coupling of the bulk region to the first power rail. During an ESD event, the ESD detection circuit biases the bulk region to trigger the BJT thereby releasing ESD stress. Research and experiment demonstrate the substrate-triggered technique can substantially improve the ESD protection level of an MOS transistor.

30 Claims, 18 Drawing Sheets

SUBSTRATE-TRIGGERED TECHNIQUE FOR ON-CHIP ESD PROTECTION CIRCUIT

BACKGROUND OF THE INVENTION

1. Field of the Invention

The present invention generally relates to an electrostatic discharge (ESD) protection circuit. Specifically, the present invention relates to a substrate-triggered technique for an on-chip ESD protection circuit in the integrated circuits (IC).

2. Description of the Related Art

With the scaled-down device dimension, shallow junction depth, thinner gate oxide, lightly-doped-drain (LDD) structure, and use of salicide process techniques in advanced deep-submicron complementary metal-oxide-semiconductor (CMOS) technologies, CMOS integrated circuit (IC) products become more susceptible to ESD damage. Therefore, on-chip ESD protection circuit had been built to protect the devices and circuits of the IC from ESD damages. In general, the ESD robustness of commercial IC products should exceed 2 kV in the human-body-model (HBM) ESD events. To sustain a high ESD voltage, on-chip ESED protection circuit often has large device dimension. Typically, the N-type Metal Oxide Semiconductor field effect transistor (NMOS) in input/output (I/O) circuits for ESD protection has a total channel width greater than 300 μm. With such a large device dimension, the NMOS is often designed with a multiple fingered layout. The finger-type layout pattern of the traditional NMOS device and its corresponding cross-sectional view are shown in FIGS. 1A and 1B. The cross-sectional view shown in FIG. 1B corresponds to the dashed line A–A' of FIG. 1A. As shown in FIG. 1A, the traditional finger-type NMOS has two poly-silicon fingers 10 serving as the gate(s) of the finger-type NMOS. The drain electrode, the source electrode and the bulk electrode of the finger-type NMOS are respectively represented by an n+ doped region 12, two n+ doped regions 14 and a p-well 15. The p-well 15 is grounded via two p+ doped regions 16. Several small finger-type NMOSs, as shown in FIGS. 1A and 1B can be connected in parallel to create a large device dimensioned NMOS with high current driving ability. However, a large-dimension NMOS constructed with multiple, parallel finger-type NMOSs is unable to be uniformly switched on (whereas simultaneous 'firing' of the parallel NMOSs would allow the device to bypass ESD current). Rather, only several fingers of a large device dimensioned NMOS are able to be switched on simultaneously thereby resulting in NMOS damage from the ESD pulse. Often, this methodology nets insufficient ESD protection levels despite the NMOS's large device dimension capacity.

To improve the turn-on uniformity among the multiple fingers of the above described device, a gate-driven design had been used to increase ESD protection levels of the large device dimensioned NMOSs. FIG. 2 shows the concept of the gate-driven design. However, experiments and journal papers have demonstrated that the ESD level of a gate-driven NMOS is dramatically decreased when the gate voltage is over-increased. The gate-driven design causes ESD current to flow through the channel surface of NMOS making the NMOS vulnerable to burn-out from the ESD energy.

To investigate ESD performance of the gate-driven design, NMOS's with different channel widths, but a fixed channel length of 0.3 μm, had been fabricated in a 0.18 μm salicide CMOS process with a silicde-blocking mask 17 to hinder the formation of silicide material on the drain and source regions of the NMOS devices. A transmission line pulse generator (TLPG) with a pulse width of 100 ns is used to measure the second breakdown current (It2) of the fabricated NMOSs under different gate biases. In theory, the human body model (HBM) ESD level VESD is equal to the product of It2 and. 1.5 kΩ, the equivalent resistance for the HBM. The TLPG measured I–V curves of NMOSs under different gate biases are shown in FIG. 3, where the channel width of the NMOS is 300 μm. The dependence of It2 on the gate biases for two different sized NMOSs is shown in FIG. 4. In FIG. 4, the It2 of the gate-driven NMOS with a channel width of 300 μm is first increased when the gate bias is increased from 0V. However, It2 drops suddenly when gate bias is greater than some critical value (~0.3V). This same 'dropping' also occurs at a voltage around 0.2V for the NMOS with a W/L of 100 μm/0.3 μm. Hence, these results demonstrate the aforementioned conclusion, that over-biased gate voltage will degrade the performance of ESD protection.

SUMMARY OF THE INVENTION

The objective of the present invention is to provide a substrate-triggered ESD protection circuit where regardless of substrate current volume, the substrate-triggered ESD protection circuit provides steady and excellent ESD protection performance.

The present invention achieves the above-indicated objective by providing an ESD protection circuit comprised of a first MOS transistor of a first conductive type and an ESD detection circuit. Further, the first MOS transistor has a bulk region of a second conductive type, a gate, a source region of the first conductive type and a drain region of the first conductive type. The gate is positioned on the bulk region, the source is coupled to a first power rail, and the drain is coupled to a pad. The source region, the bulk region and the drain region construct a bipolar junction transistor (BJT). The ESD detection circuit is between, and connected to, the first power rail and the pad. During normal operation, the ESD detection circuit initiates a coupling of the bulk region to the first power rail. During an ESD event, the ESD detection circuit biases the bulk region to trigger the BJT and in-turn releases ESD stress.

The present invention can also provide an MOS transistor with superior ESD protection. Wherein the MOS transistor comprises a well region of a first conductive type, a control gate on the well region, a drain region and a source region of a second conductive type. The drain and source regions are positioned on the well region, adjacent to the control gate, and respectively coupled to a pad and a first power rail. The drain region, the well region and the source region construct another BJT. A well contact region of the first conductive type is positioned on the well region and coupled to an ESD detection circuit. During an ESD event, the ESD detection circuit biases the well region thereby triggering the BJT to release ESD current. During normal operation, the ESD detection circuit prompts the well region to couple with the first power rail.

Another benefit of the present invention provides a method for improving ESD robustness in an MOS transistor. Here, the MOS transistor is comprised of a substrate, a gate, a source and a drain. During normal operation, the substrate is coupled to a first power rail and the gate is coupled to the first power rail through an ESD detection circuit. The source and the drain are coupled to the first power rail and the pad, respectively. The source, the substrate and the drain constitute a BJT. The method detects occurrence of an ESD event between the first power rail and the pad. When such an ESD event is detected, the second step of the method is to bias the substrate of the MOS transistor thereby triggering the BJT for releasing an ESD current.

The primary advantage of the present invention is dramatically improvement ESD protection level in an NMOS transistor. Constructed by an 0.18-μm CMOS process, the substrate-triggered NMOS with a W/L of 300 μm/0.3 μm (according to the present invention) has an HBM ESD level of 3.5 kV. In contrast, the traditional gate-coupled NMOS technique, also with a W/L of 300 μm/0.3 μm on the same wafer, has an HBM ESD level of only 0.5 kV.

BRIEF DESCRIPTION OF THE DRAWINGS

The drawings referred to herein are to be understood as not being drawn to scale except where specifically noted. The emphasis instead being placed upon illustration of the principles of advantages of the present invention.

In the accompanying drawings.

DETAILED DESCRIPTION OF THE PREFERRED EMBODIMENTS

Reference is now made in detail to embodiments of the present invention that illustrate the best mode presently contemplated by the inventor(s) for employing the present invention. Other embodiments are also described herein.

Figure 5A:
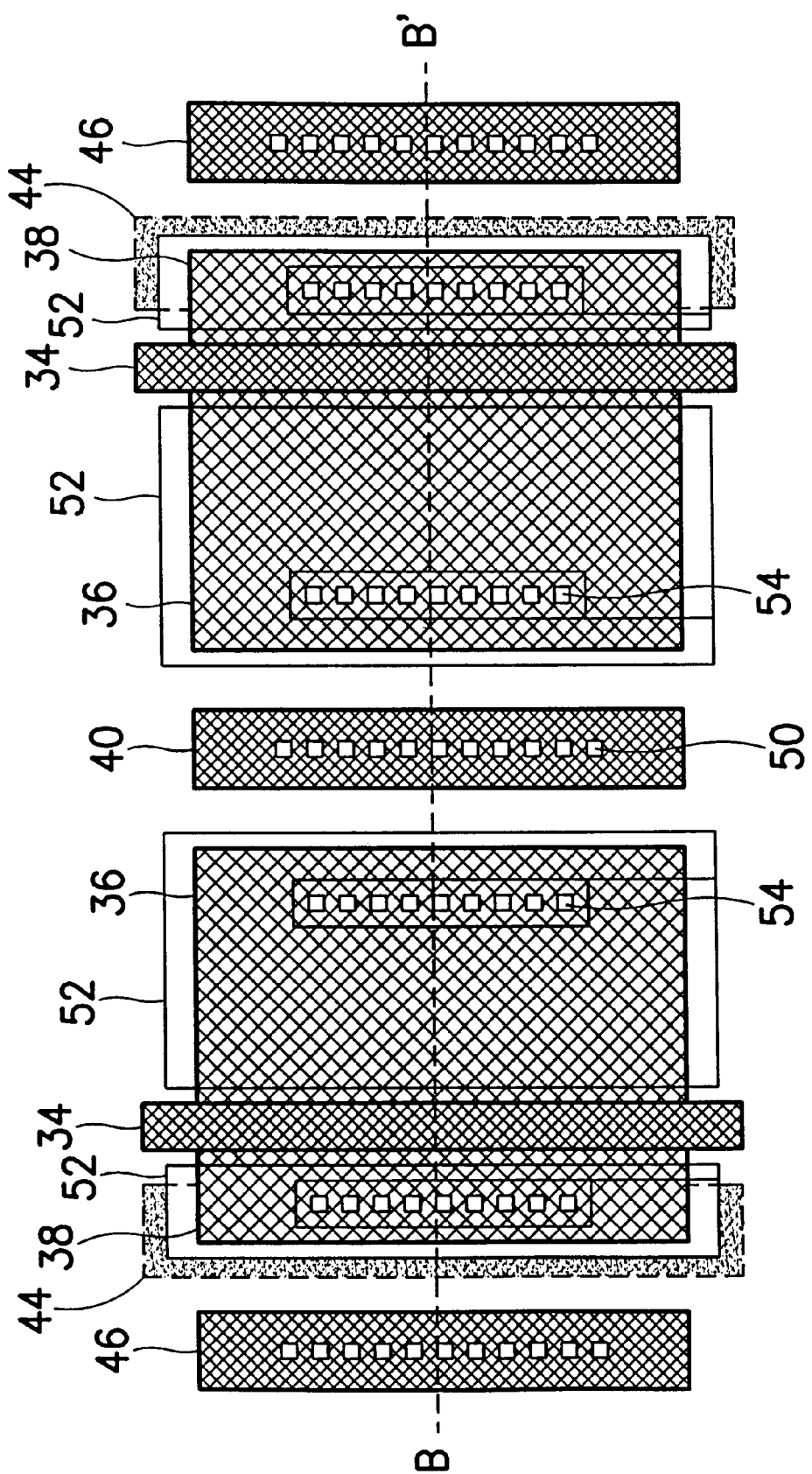
FIGS. 5A and 5B respectively show the layout pattern and corresponding device cross-sectional view of the substrate-triggered NMOS according to the present invention.
Figure 5B:
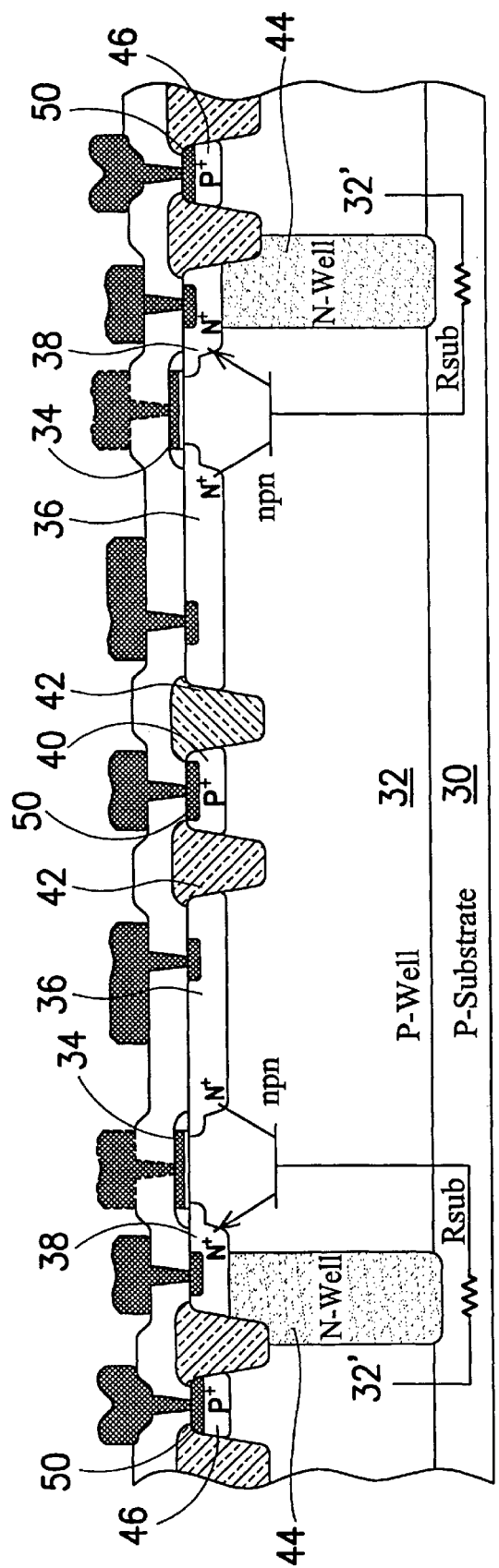

The layout pattern and corresponding device cross-sectional view of the substrate-triggered NMOS according to the present invention are shown in FIGS. 5A and 5B, respectively. Several small finger-type NMOSs as shown in FIGS. 5A and 5B, can be connected in parallel to create a large device dimensioned NMOS with high current driving ability. The substrate-triggered NMOS in FIGS. 5A and 5B is positioned in a p-well 32 on a p-substrate 30. Two poly-silicon gates 34, serving as the gate (electrode) of the substrate-triggered NMOS, are positioned above the p-well 32. Two n+ doped regions 36, functioning as the drain (electrode) of the substrate-triggered NMOS, are positioned between poly-silicon gates 34 on the surface of the p-well 32. Between the n+ doped regions 36, a p+ doped region 40 is positioned for the electrical connection to p-well 32 and serves as the trigger node for the substrate-triggered NMOS. Isolation object(s) 42, in this example, the silicon oxide formed by the shallow trench isolation processes, isolate the p+ doped region 40 from the n+ doped regions 36. The two n+ doped regions 38 on the surface(s) of p-well(s) 32 provide the source (electrode) of the substrate-triggered NMOS. As shown in FIG. 5B, one of the n+ doped regions 38, a p-well 32 and one of the n+ doped region 36 together can construct a parasitic npn bipolar junction transistor (BJT).

An n-well 44 is positioned to partially overlay and electrically couple with the n+ doped region 38. Beside the n+ doped region 38, a p+ doped region 46 forms the electrical connection to p-well 32'. All the surfaces of the p+ regions 46 and 40 are capped by silicide material. The areas of the n+ doped regions 36 and 38 are patterned by a photo mask 52 to block silicide material on their surfaces but the contact areas will be still covered with suicide.

The contacts 54 for the n+ doped regions 36 must be separated from poly-silicon gate 34 by a specific distance, as shown in FIG. 5A, to sustain a higher ESD stress. The shortest conductive path from the base of the npn BJT to the p+ doped region 46 must travel around n-well 44, to take advantage of the higher resistance provided by spread resistor Rsub.

Figure 6:
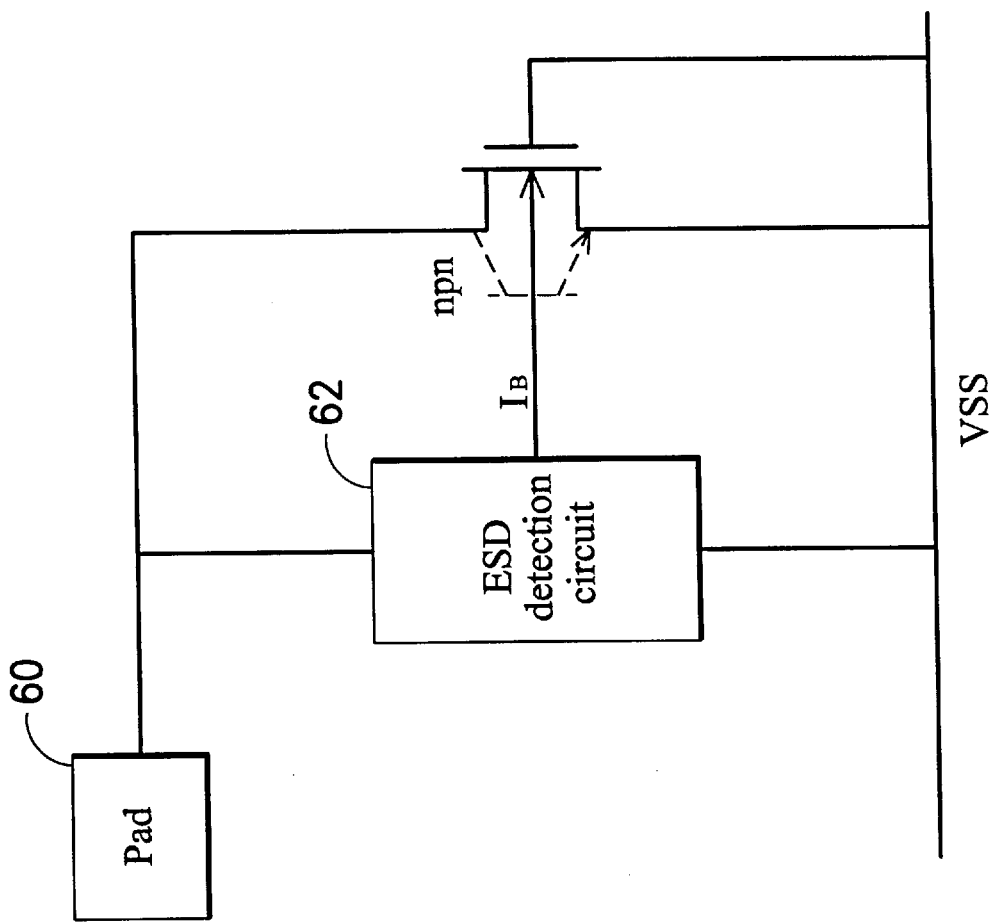
FIG. 6 shows the substrate-triggered NMOS design for ESD protection.

According to the present invention, the substrate-triggered design for use in ESD-protected NMOSs is shown in FIG. 6. The n+ doped region 36 (the drain electrode from FIG. 5B) is coupled to pad 60 via contacts. The n+ doped region 38 (the source electrode) and the p+ doped region 46 are all coupled to power rail VSS. The p+ doped region 40 is coupled to an ESD detection circuit 62. During normal operation, the ESD detection circuit 62 makes the p+ doped region 40, also serving as a bulk electrode of the NMOS, couple to the power rail VSS. During ESD-stress condition, the instant ESD detection circuit 62 discovers an ESD event occurring on pad 60, ESD detection circuit 62 biases the bulk electrode to trigger activation of the npn BJT thereby releasing ESD stress.

Figure 1A:
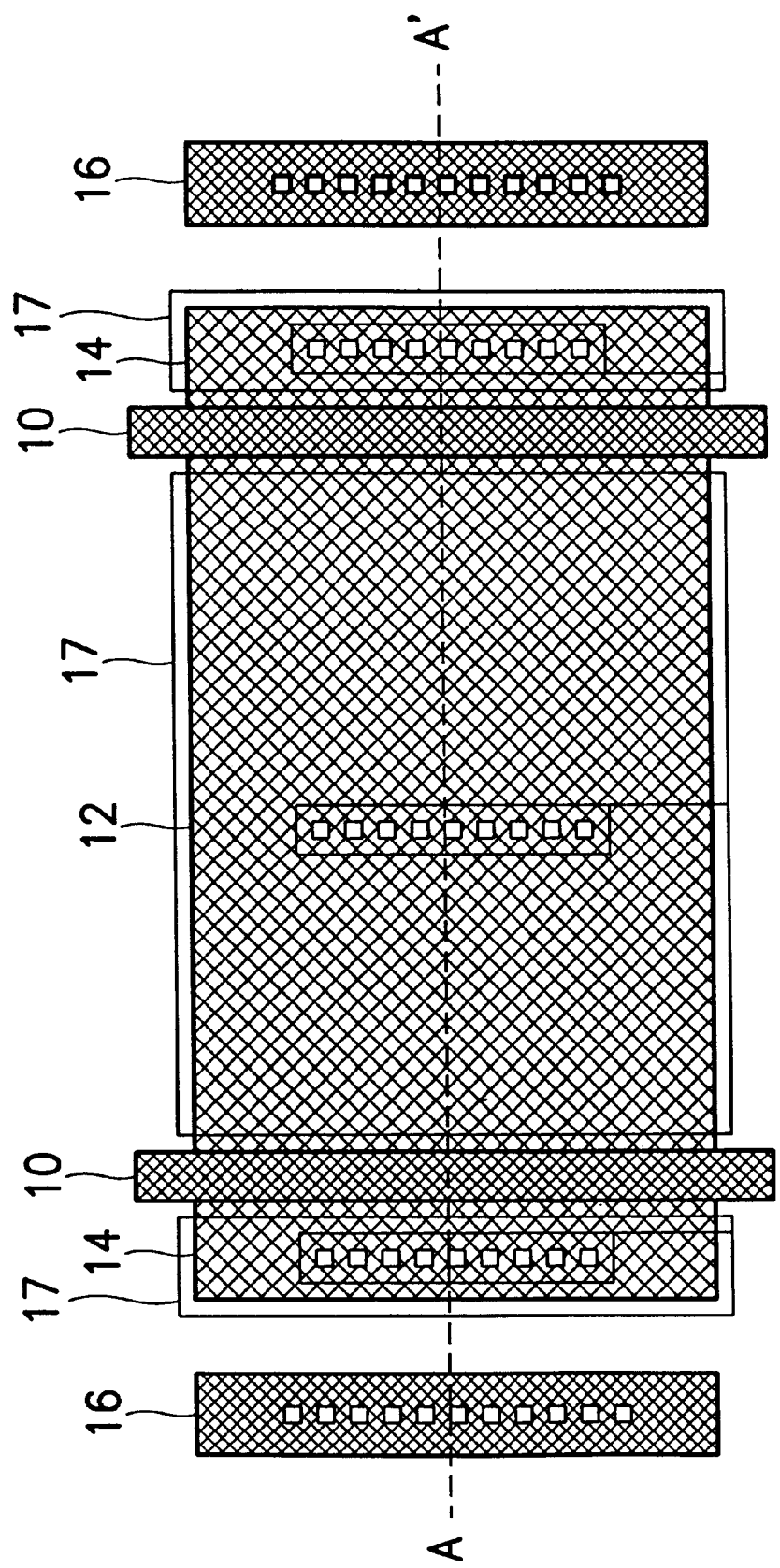
FIG. 1A shows the finger-type layout pattern of the traditional NMOS device.
Figure 1B:
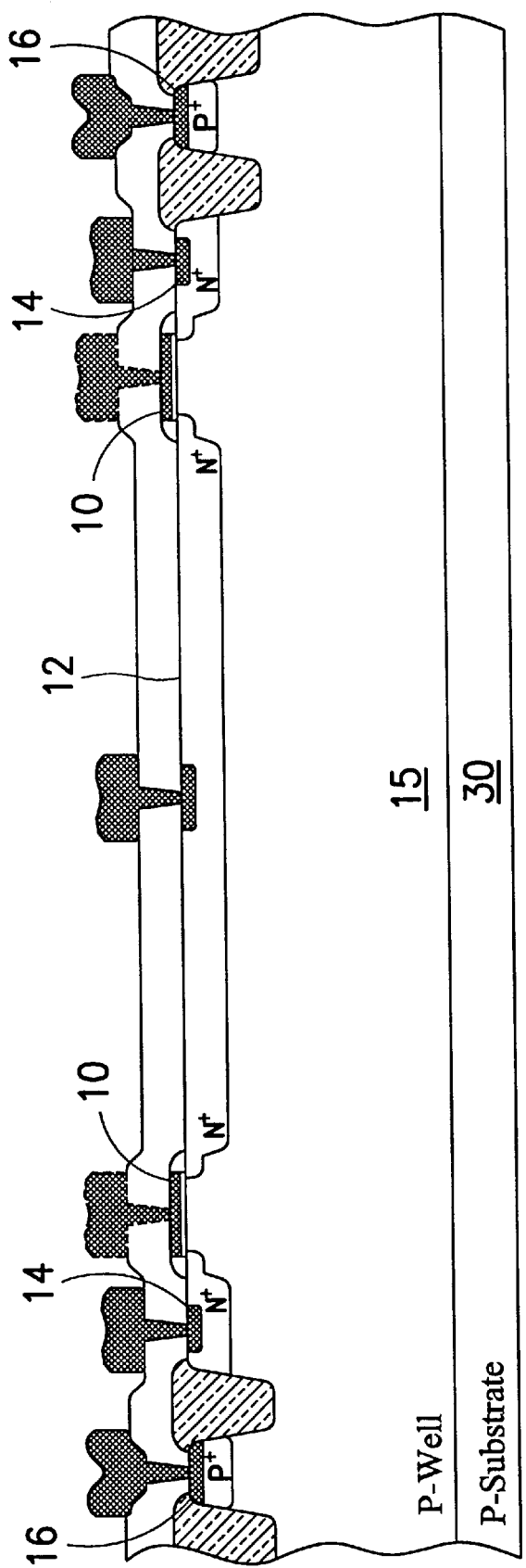
FIG. 1B shows the cross-sectional view of the NMOS in FIG. 1.
Figure 2:
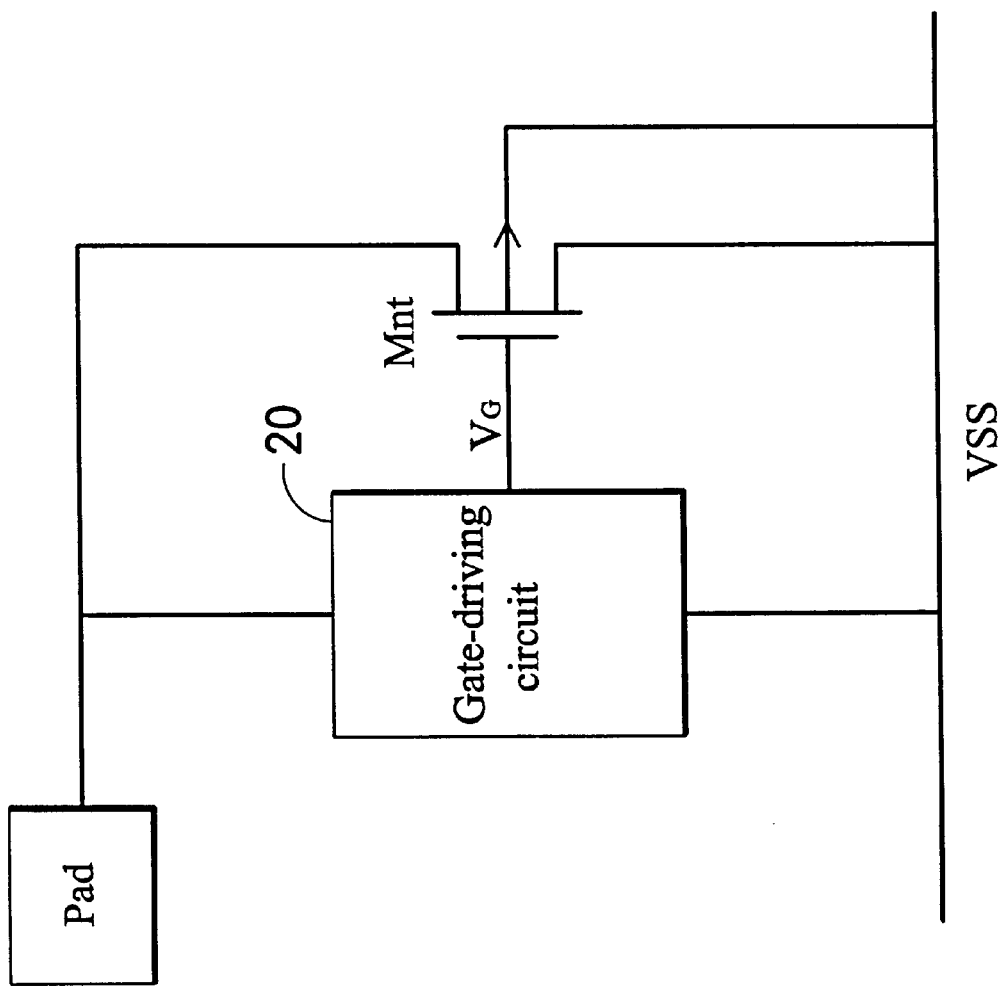
FIG. 2 demonstrates the concept of the gate-driven NMOS design for ESD protection.
Figure 3:
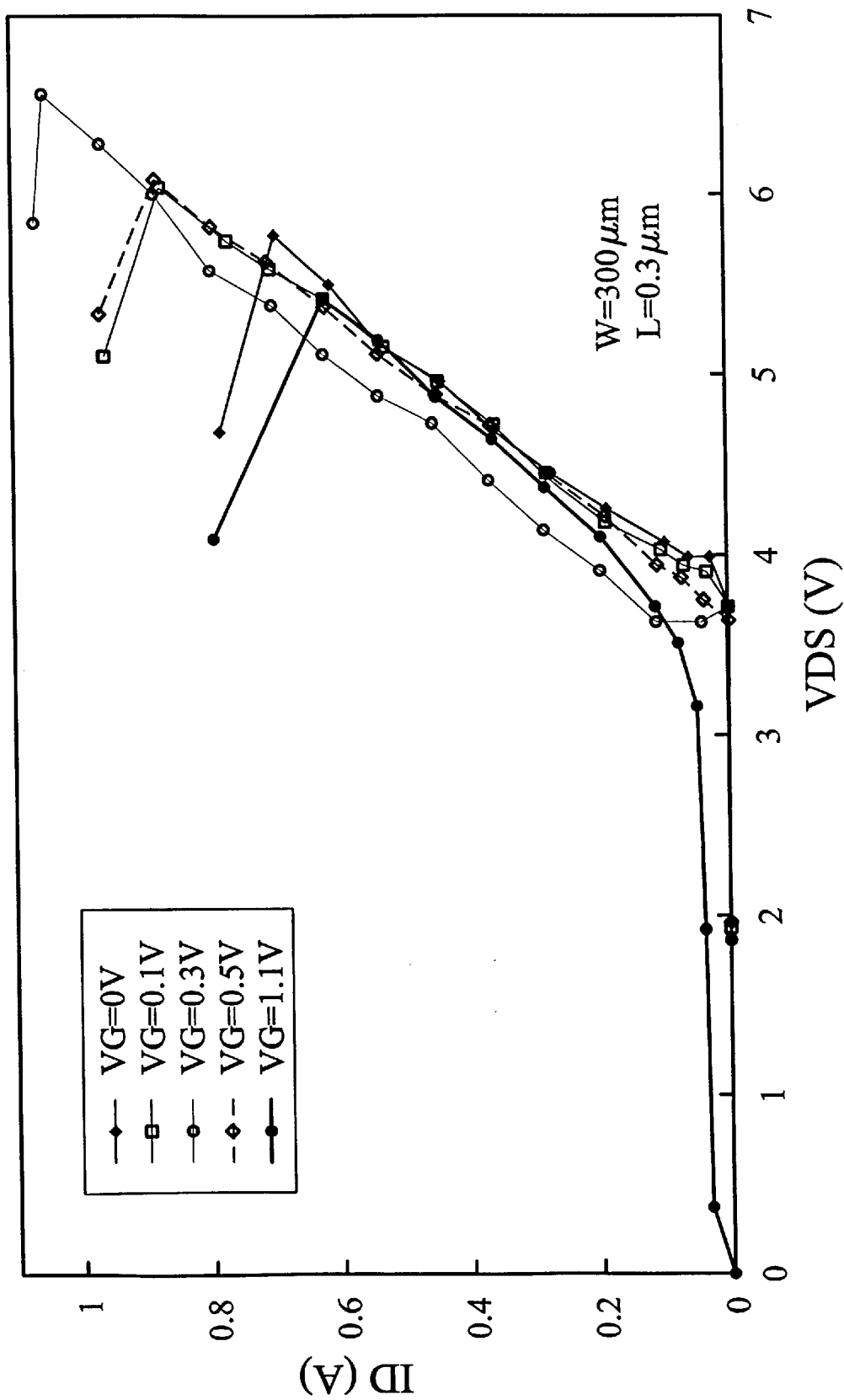
FIG. 3 illustrates the TLPG-measured I–V curves of an NMOS under different gate biases.
Figure 4:
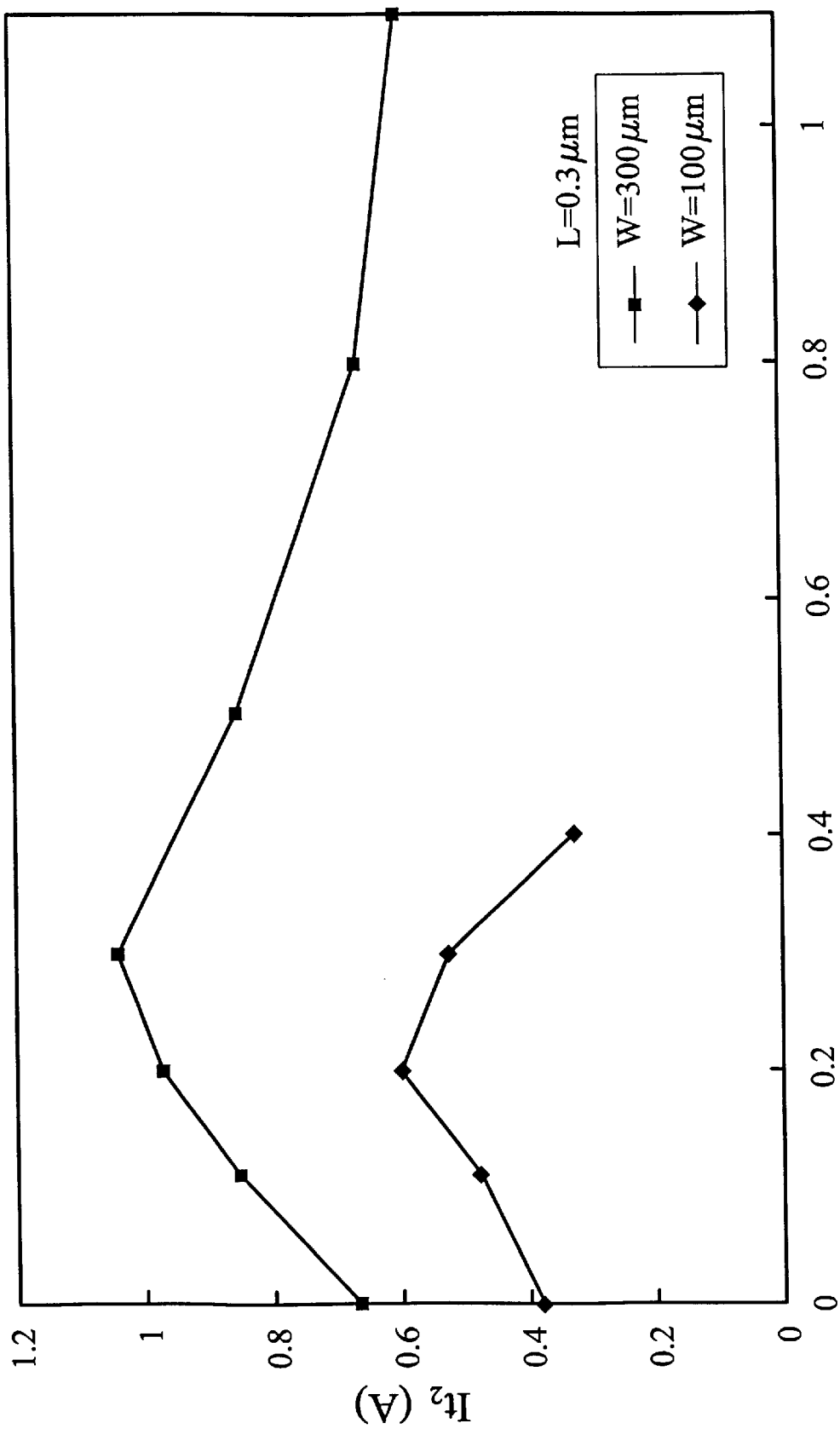
FIG. 4 shows the dependence of It2 on the gate biases for two different sized NMOSs.
Figure 7:
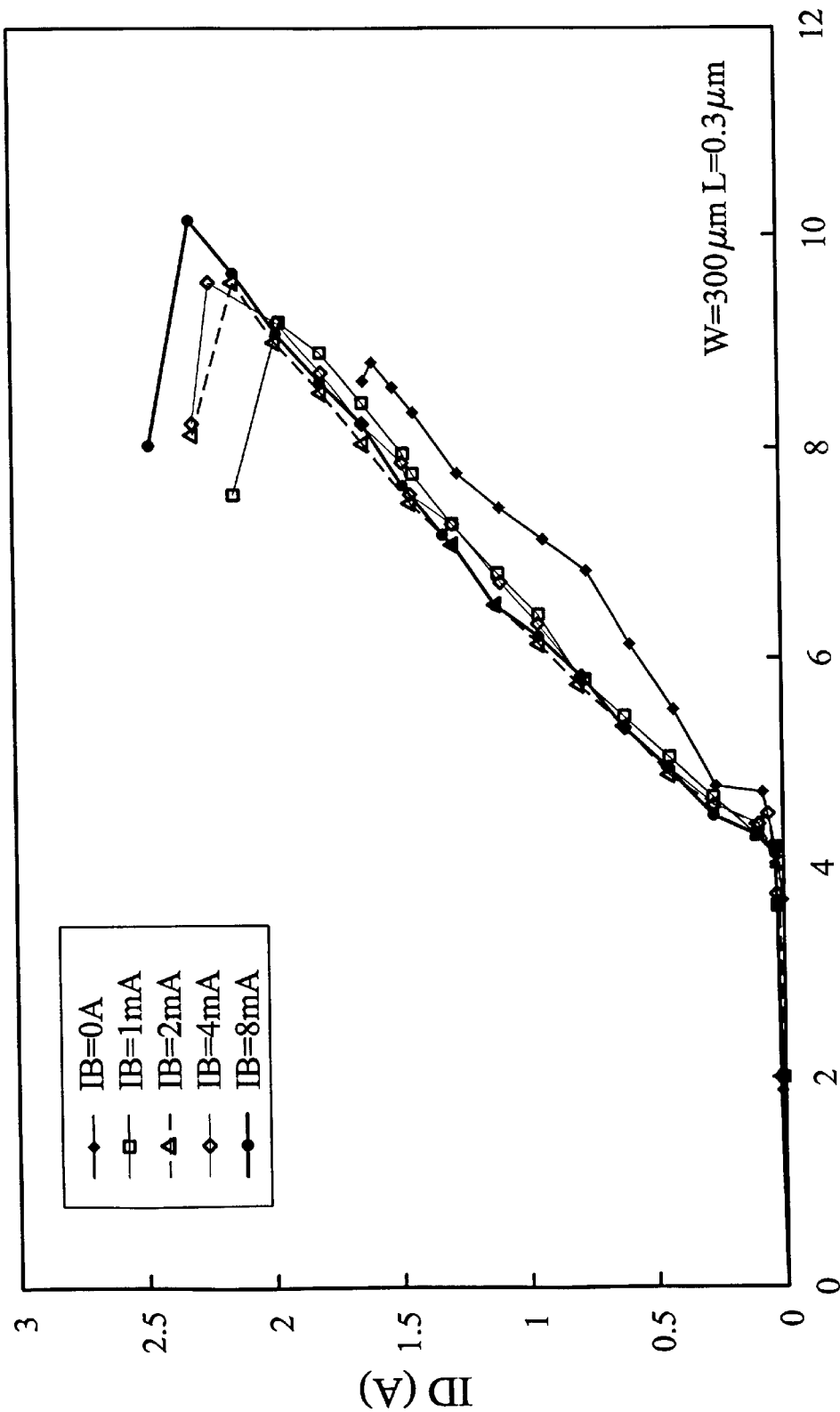
FIG. 7 shows the TLPG-measured I–V curves of an NMOS under different substrate bias currents ($I_B$) according to the present invention.
Figure 8:
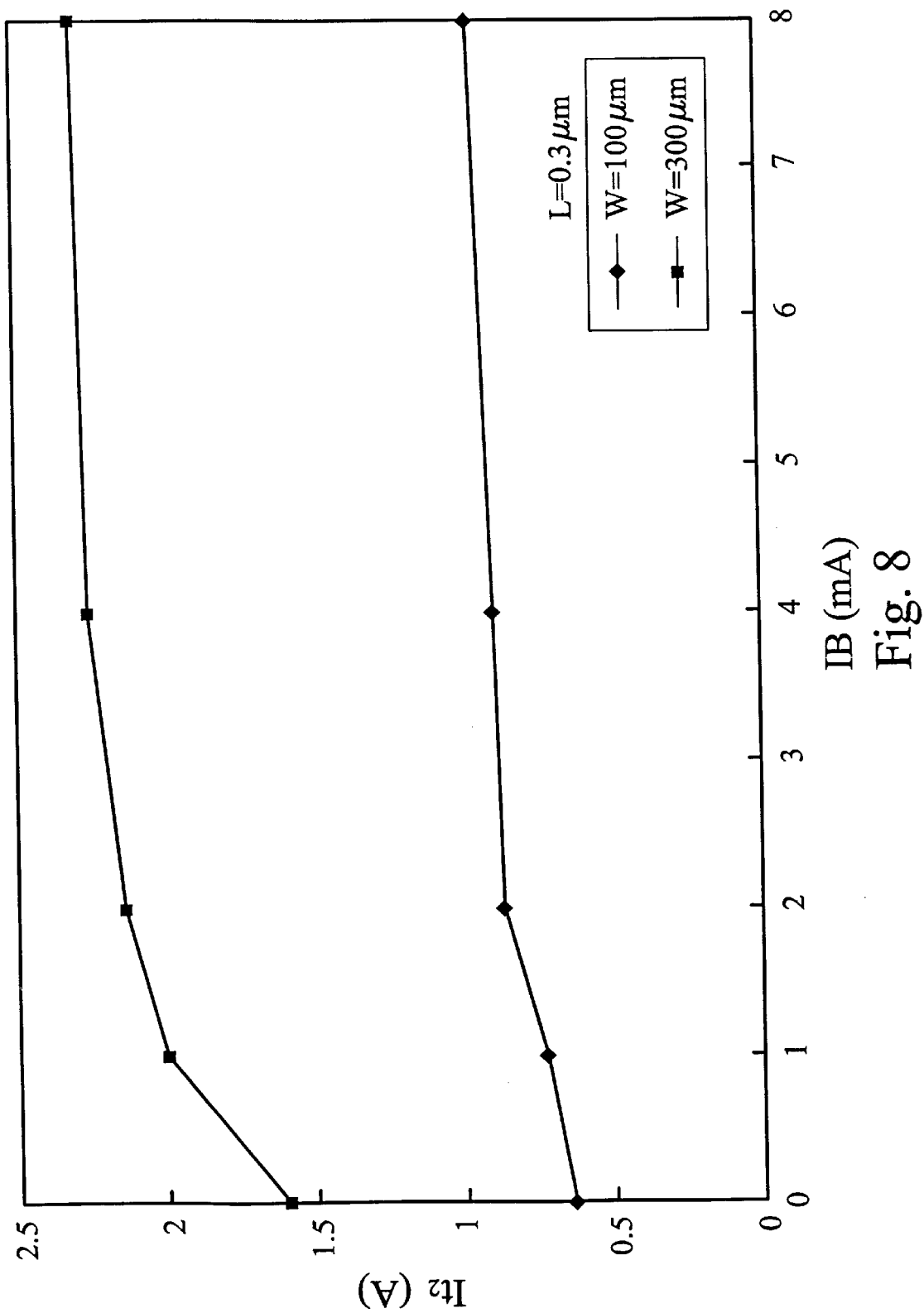
FIG. 8 shows the dependence of It2 on the substrate bias current.

In order to compare ESD protection performance of the present invention against the gate-driven design in the prior art, a substrate-triggered NMOS, with the same device dimensions and fabrication processes used for the gate-driven NMOS, has been measured by TLPG. All the measured NMOSs have different channel widths but a fixed channel length of 0.3 μm and are fabricated by a 0.18-μm salicide CMOS process with a silicide-blocking mask. TLPG inputs a pulse with a pulse width of 100 ns into pad 60 to find the It2 of the fabricated NMOSs under different substrate biases. The TLPG-measured I–V curves of NMOSs under different substrate bias are shown in FIG. 7 (where the measured NMOS has a W/L of 300 μm/0.3 μm). The dependence of It2 on the substrate bias is shown in FIG. 8. Independent of NMOS channel width measured at 100 μm or 300 μm, It2 increases as long as bias current IB increases, provided by the ESD detection circuit 62. Note that the abrupt degradation of It2 as seen in FIG. 4 is not found in FIG. 8. The substrate-triggered effect 'instructs' the parasitic lateral npn BJT of the NMOS structure to pull current flowing through the substrate (bulk) of the NMOS, which has been located far enough away from the surface channel of the NMOS. The NMOS's bulk comprises a large volume to dissipate the ESD generated heat; therefore the substrate-triggered NMOS can sustain a much higher ESD level within the same silicon area.

Figure 9:
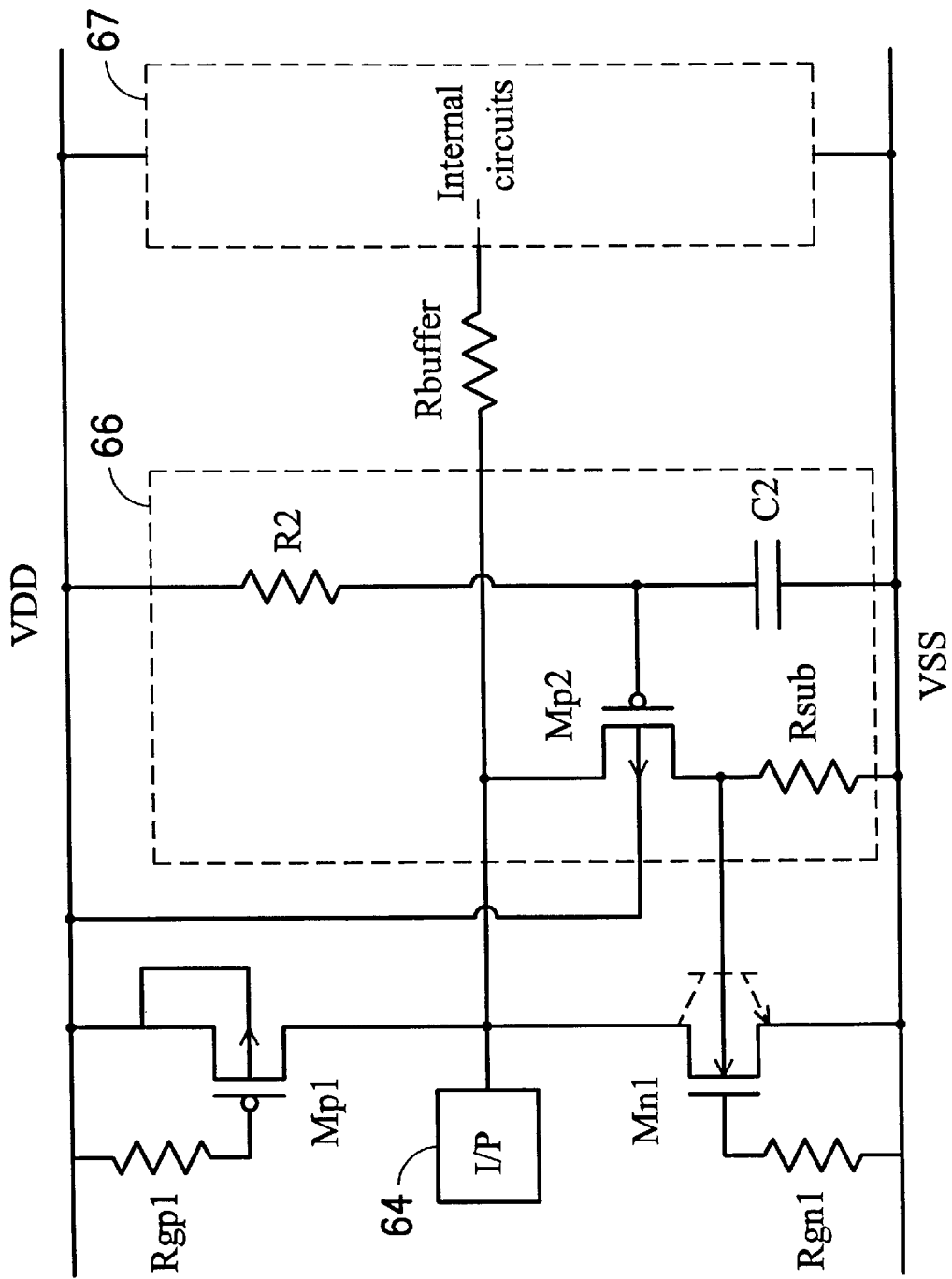
FIG. 9 illustrates the ESD protection circuit design for an input port to actualize the substrate-triggered technique on an NMOS device according to the present invention.

The ESD protection circuit for an input port to actualize the substrate-triggered technique on an NMOS device according to the present invention is shown in FIG. 9. The input port is composed of a pad 64 and a buffer resistor (Rbuffer) located between, and connected to, pad 64 and internal circuits 67. The design composed of PMOS Mp1 and a gate resistor Rgp1 located between, and connected to, pad 64 and power rail VDD is well known in the art. In the current invention, a substrate-triggered NMOS is connected between pad 64 and power rail VSS, wherein the NMOS is composed of a drain electrode coupled to pad 64, a source electrode coupled to power rail VSS, and a gate electrode coupled either directly or, via a gate resistor Rgn1, to power rail VSS.

ESD detection circuit 66 is used for driving the bulk electrode of Mn1, where the substrate resistor Rsub is used for coupling the bulk electrode of Mn1 to VSS during normal operation e.g., operation without an ESD event. The ESD detection circuit 66 contains a PMOS Mp2 with a source electrode, a drain electrode and a bulk electrode connected to pad 64, the bulk electrode of Mn1 and the power rail VDD, respectively. The ESD detection circuit further has a RC-delay circuit constructed from a detection capacitor C2 and a detection resistor R2 connected in series (see FIG. 9). The product of R2 and C2 must be near the order of a micro-second (μs) to distinguish an ESD event from normal operation. During normal operation, the power rail VDD is stably biased at a fixed potential, such as 1.8, 2.5 or 3.3 volt, so that, through the conductivity of R2, the gate electrode of Mp2 is also biased at the electric potential of the power rail VDD to turn off Mp2. The bulk electrode (substrate) and the gate electrode of Mn1 is coupled to power rail VSS enabling Mn1 to be turned off, whereby the signals in the pad 64 can convey to internal circuits 67. When a positive-to-VSS ESD 'zapping' occurs on the pad 64, the RC circuit (R2 and C2) temporarily maintains the gate voltage of Mp2 at approximately 0V. Therefore, Mp2 is simultaneously turned on to conduct a trigger current into the substrate of Mn1 thereby initiating the substrate-triggered effect. Thus, ESD current will be drained off by the parasitic npn BJT while the IC remains protected.

The primary function of ESD detection circuit 66 is to maintain, during normal operation, the substrate of Mn1 coupled to VSS; and to bias, during an ESD event, the substrate of Mn1, such that the parasitic npn BJT is triggered to release ESD current. Again, the embodiment of the detection circuit 66 in FIG. 9 is simply an example and does therefore not constrain the application of the present invention.

Figure 10:
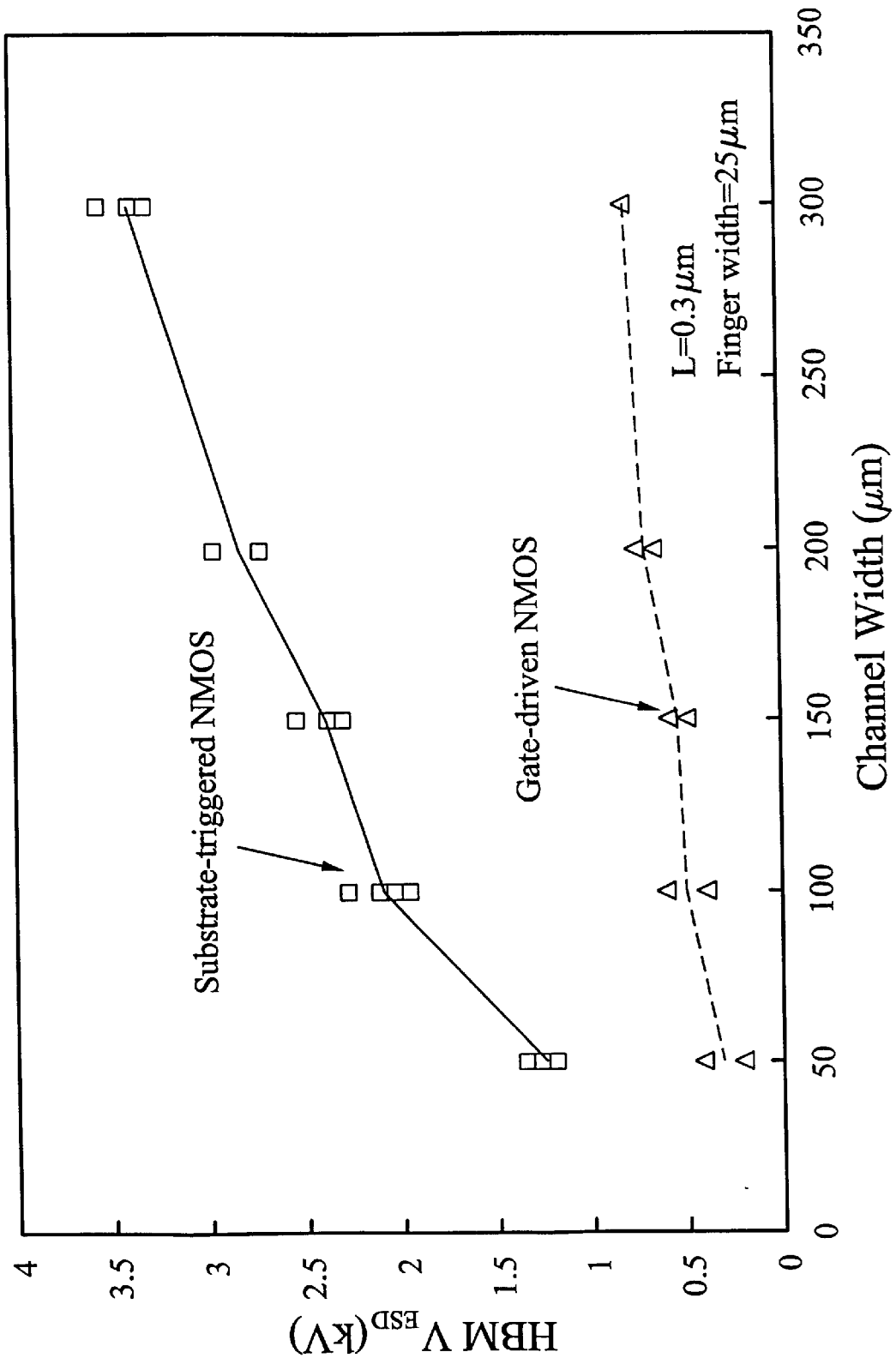
FIG. 10 compares the positive-to-VSS HBM ESD levels of the fabricated input ESD protection circuits, with gate-driven design versus substrate-triggered design, using different NMOS channel widths.

In FIG. 10, the positive-to-VSS HBM ESD levels of the fabricated input ESD protection circuits utilizing gate-driven design or substrate-triggered design under different NMOS channel widths have been tested and compared. All circuits tested were fabricated on the same wafer using the 0.18-μm salicide CMOS process technology at Taiwan Semiconductor Manufacturing Company (TSMC). The NMOS with substrate-triggered design rendered by the present invention demonstrates obvious improvement in ESD protection levels relative to the NMOS with gate-driven design found in the prior art. In FIG. 10, the substrate-triggered NMOS (W/L=300 μm/0.3 μm) can sustain an ESD stress level of 3.3 kV. In contrast, an NMOS with the same device dimension, yet absent the substrate-triggered design, can only withstand an ESD level of 0.8 kV. In summary, FIG. 10 verifies the superior effectiveness of the current invention's substrate-triggered technique in improving ESD robustness within 0.18-μm CMOS technology.

Figure 11:
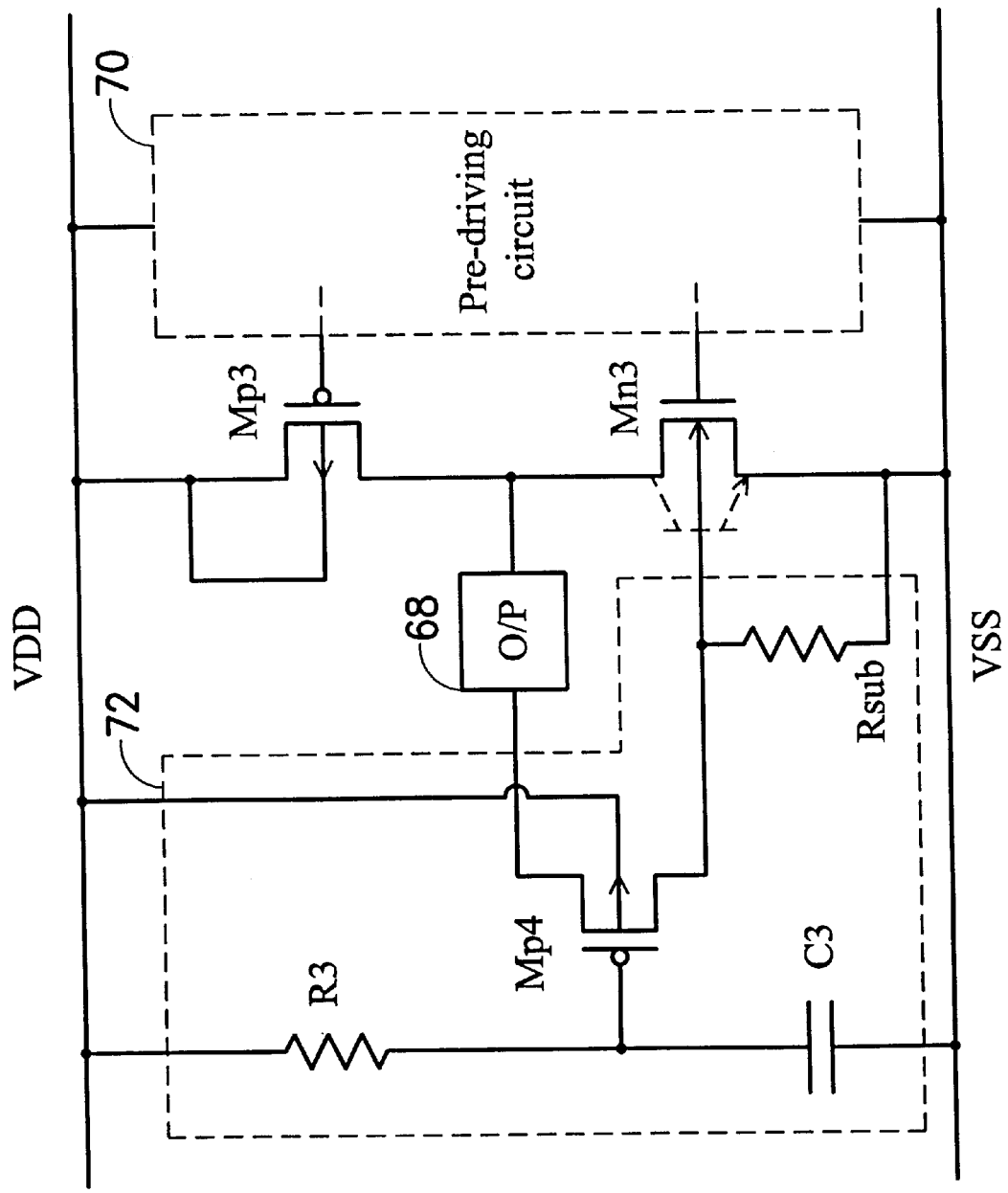
FIG. 11 illustrates the ESD protection circuit design for an output port to actualize the substrate-triggered technique on an NMOS device according to the present invention.

Beyond providing exceptional ESD protection for an input port, the substrate-triggered design can also be employed in an output port environment. FIG. 11 illustrates an output port ESD protection circuit used to apply the substrate-triggered technique to an NMOS device. Pad 68 is part of the output port and is driven by NMOS Mn3 and PMOS Mp3. Mn3 has an MOS structure similar to the NMOS in FIGS. 5A and 5B, functioning simultaneously as a large current driver and an ESD protection device. Therefore, some or all of the finger gates are driven by a pre-driving circuit 70. Concerning ESD detection circuit 72 as constructed by detection resistor R3, detection capacitor C3, the substrate resistor Rsub and the PMOS Mp4, its inherent connection and operation are both described and explained in the previous paragraph, therefore they are not re-iterated here.

Figure 12:
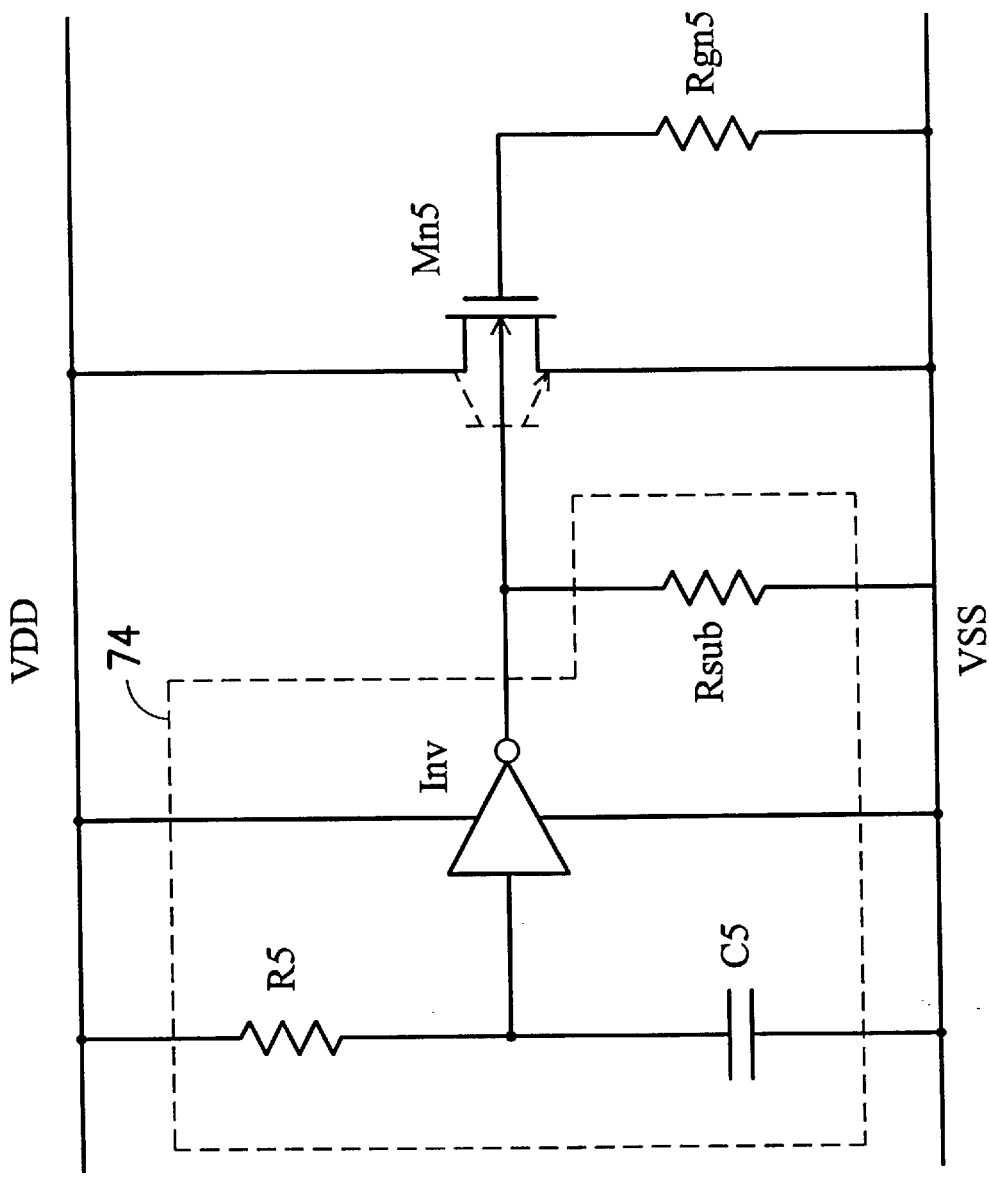
FIG. 12 shows the power-rail ESD clamp circuit with substrate-triggered design according to the present invention.

The power-rail ESD clamp circuit with substrate-triggered design according to the present invention is shown in FIG. 12, wherein NMOS Mn5 functions as an ESD protection device controlled by resistor R5, capacitor C5 and inverter Inv. Mn5 can have a structure similar to that shown in FIGS. 5A and 5B, and includes a drain electrode and a source electrode coupled respectively to power rails VDD and VSS. The RC time constant of R5 and C5 should be kept in the order of μs to distinguish whether the circuit is subject to an ESD event or operating under normal circuit condition. During normal circuit operating conditions, the input node of Inv in FIG. 12 is biased at VDD to turn off Mn5. While the ESD voltage is bridging power rails VDD and VSS, the input node of Inv in FIG. 12 is kept at a low voltage level (near to VSS) through the time delay of R5 and C5. Therefore the output node of Inv in FIG. 12 is charged up to the same voltage level on power rail VDD in order to bias the substrate of Mn5. The ESD voltage crossing power rails VDD and VSS is therefore discharged by Mn5, which again, is triggered by the substrate-triggered technique.

Figure 13:
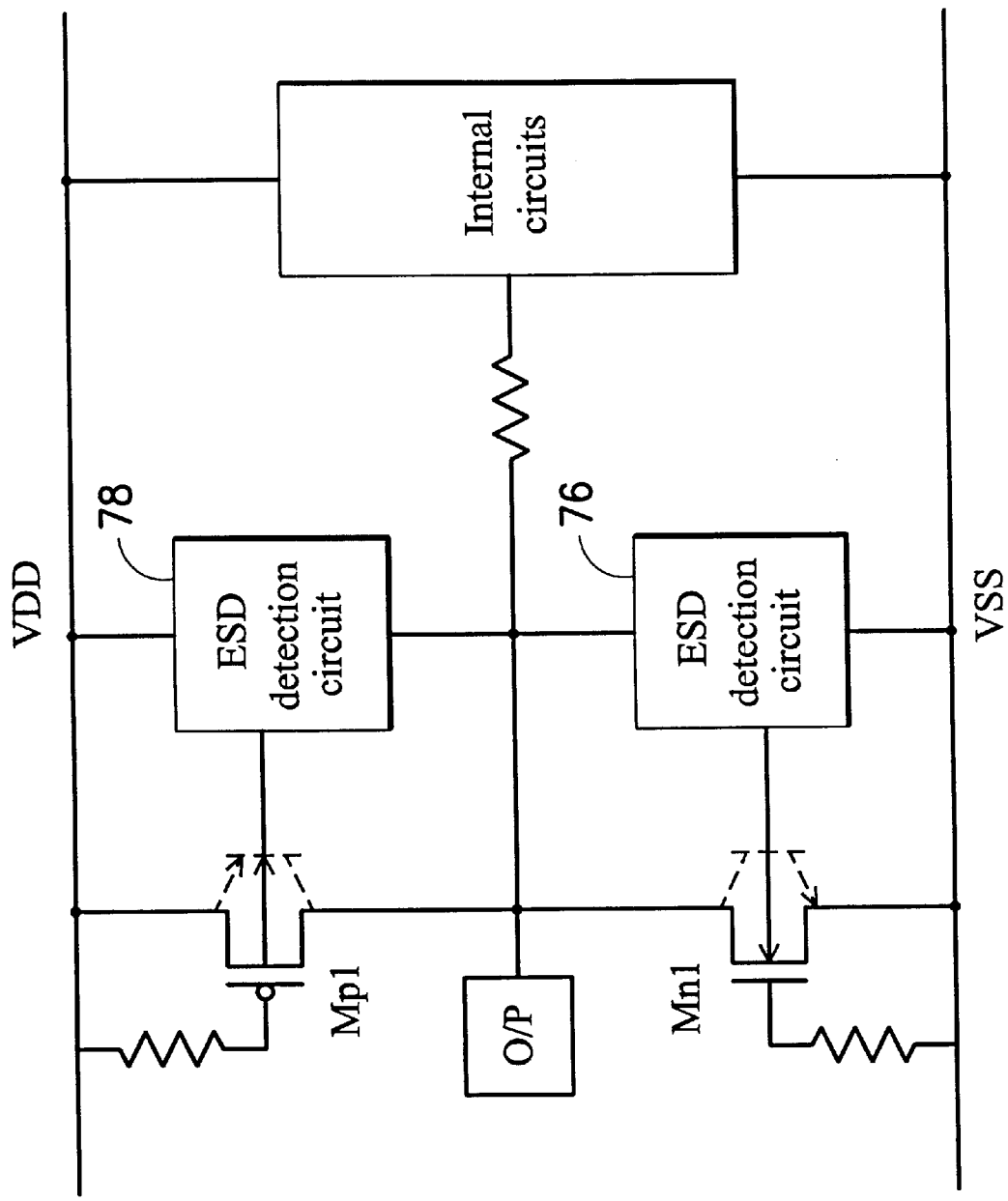
FIG. 13 diagrams the circuit used to apply the substrate-triggered ESD protection technique on both the input NMOS Mn1 and MOS Mp1.
Figure 14:
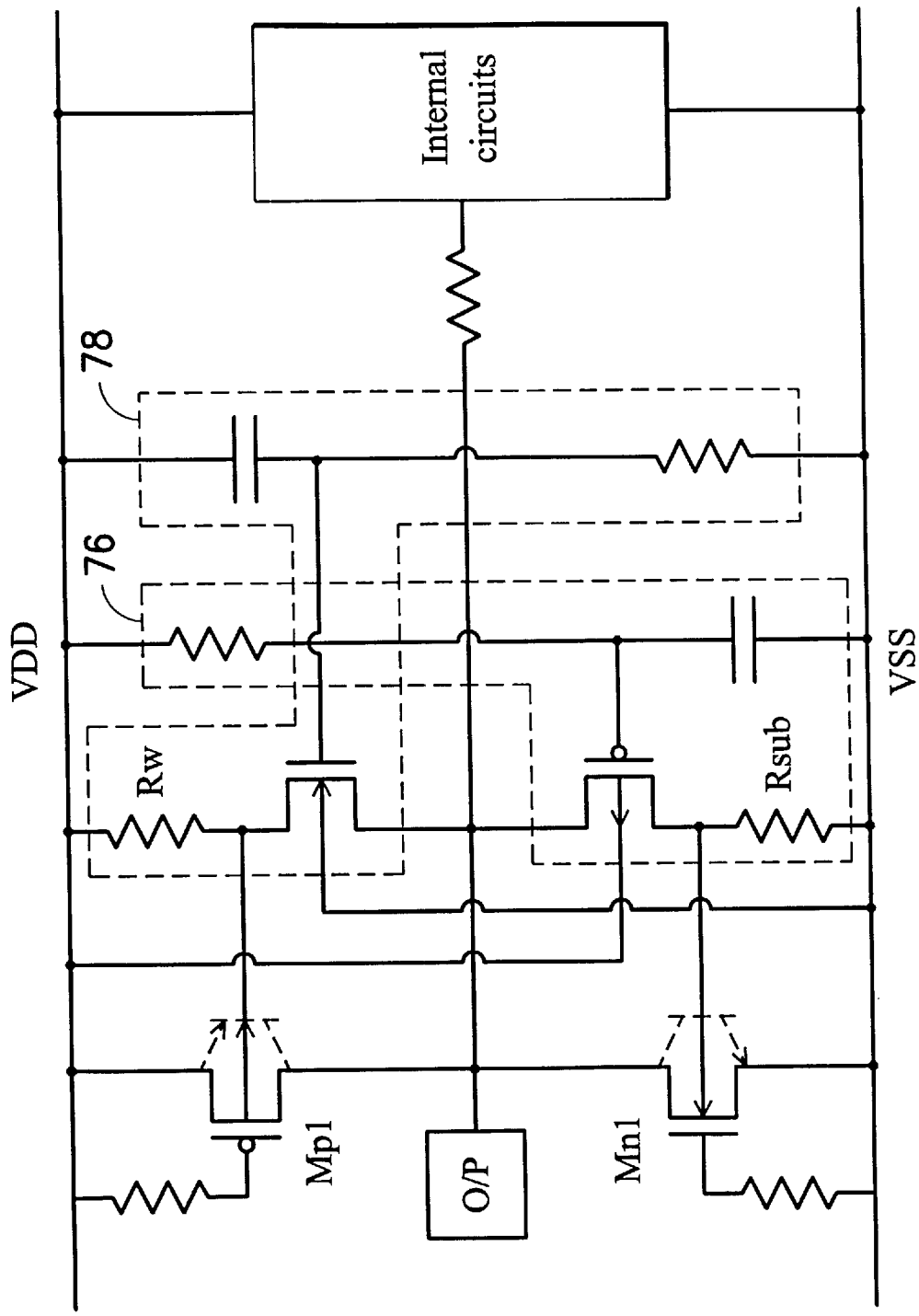
FIG. 14 shows a representative example of the design in FIG. 13

The substrate-triggered technique of the present invention can be also applied to PMOS devices to increase their ESD robustness. The circuit diagram to apply the substrate-triggered technique on both input(s) ESD-protection NMOS Mn1 and PMOS Mp1 is shown in FIG. 13. An example of this design is shown in FIG. 14, where the bulk electrodes of Mn1 and Mp1 are respectively controlled by ESD detection circuits 76 and 78. In FIG. 14, Rw represents the well resistance of the n-well where Mp1 is inside, and Rsub represents the spread resistance of the p-substrate and the p-well where Mn1 is inside. If an n-type substrate is used to fabricate the circuit, the resistor connected to the bulk of Mp1 must be changed into Rsub representing the spread resistance of the n-substrate and the n-well where Mp1 is inside. Furthermore, the resistor connected to the bulk of Mn1 must be changed into Rw representing the well resistance of the p-well where Mn1 is inside.

Figure 15:
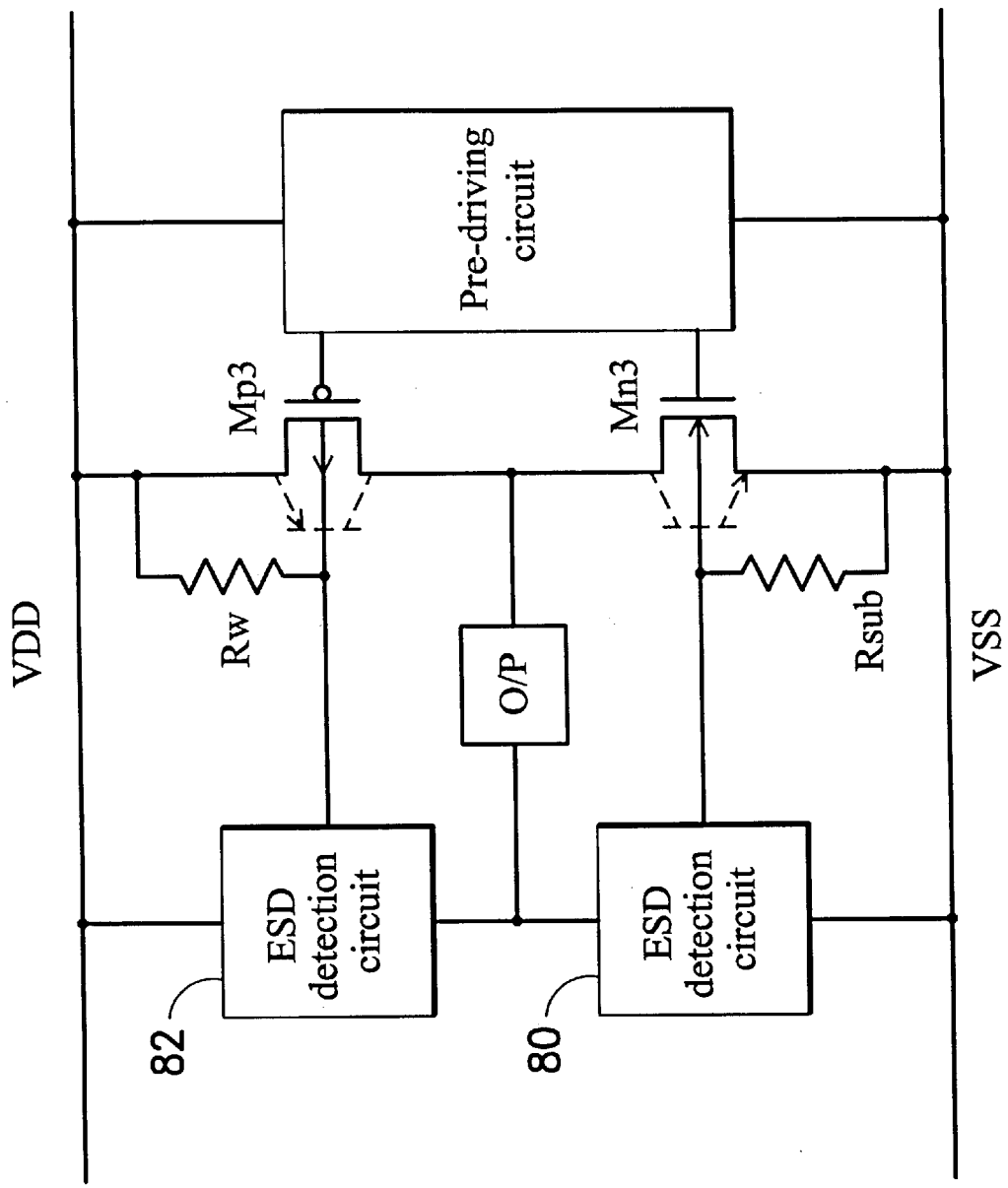
FIG. 15 diagrams the circuit used to apply the substrate-triggered ESD protection technique to both the output(s) NMOS and PMOS.
Figure 16:
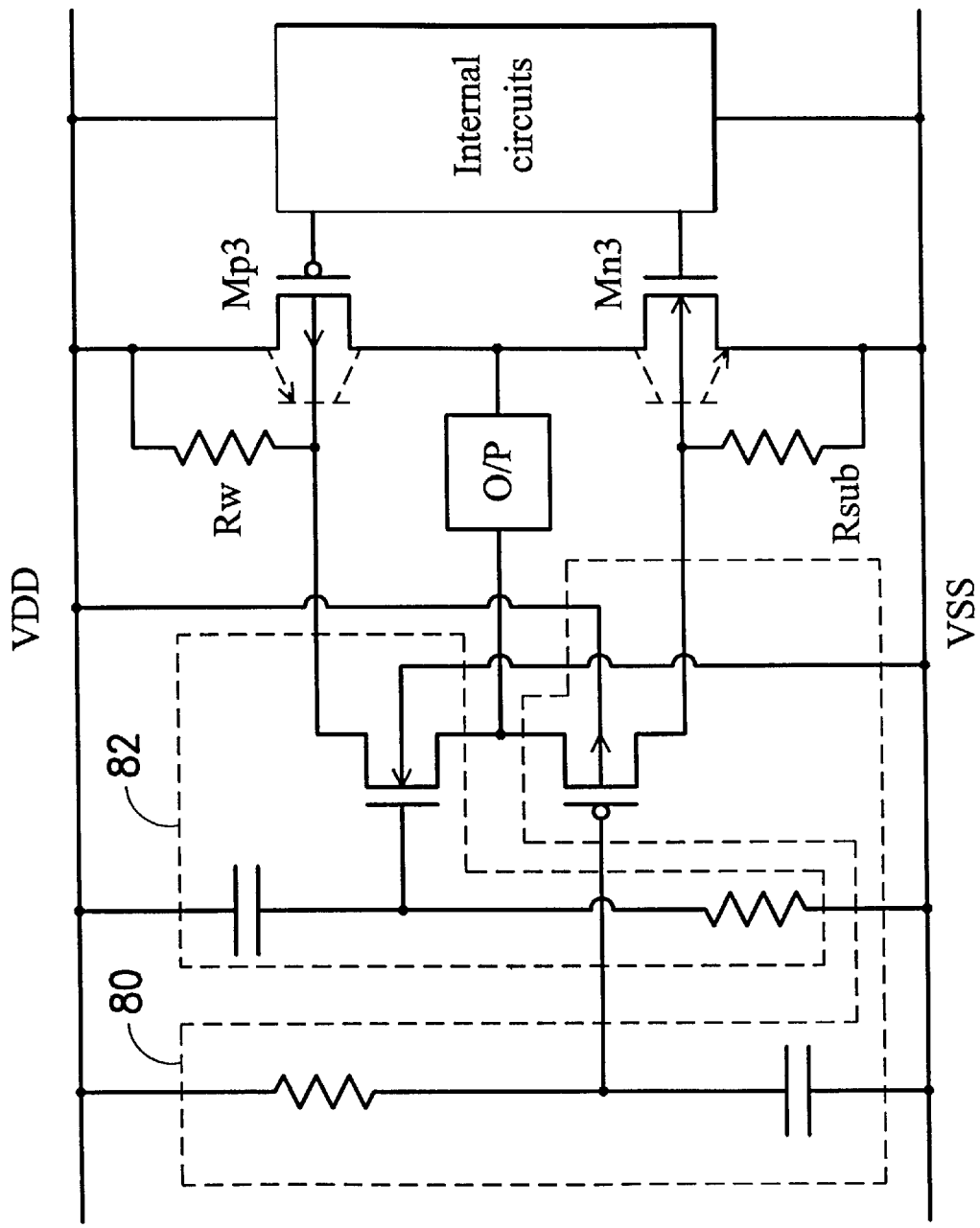
FIG. 16 shows a representative example of the design in FIG. 15.

The circuit diagram to apply the substrate-triggered technique on both the output NMOS Mn3 and PMOS Mp3 is shown in FIG. 15. A representative example of this design is shown in FIG. 16.

While the invention has been described by way of examples and in terms of the preferred embodiments, it is to be understood that the invention is not limited to the disclosed embodiments. On the contrary, it is intended to cover various modifications and similar arrangements as would be apparent to those skilled in the art. Similarly, any process steps described herein may be interchangeable with other steps in order to achieve the same result. Therefore, the scope of the appended claims should be accorded the broadest interpretation so as to encompass all such modifications and similar arrangements as defined by the following claims and their equivalents.

What is claimed is:

1. An electrostatic discharge (ESD) protection circuit, comprising:
    a first MOS transistor of a first conductive type, comprising:
        a bulk region;
        a gate located on the bulk region and coupled to a first power rail via a gate resistor;
        a source region coupled to a first power rail; and
        a drain region coupled to a pad;
        wherein the source region, the bulk region and the drain region construct a bipolar junction transistor (BJT); and
    an ESD detection circuit connected between the first power rail and the pad;
    wherein, during normal operation, the ESD detection circuit serves as the bulk region coupling to the first power rail, and, during an ESD event, the ESD detection circuit biases the bulk region to trigger the BJT thereby releasing ESD stress.

2. The ESD protection circuit as claimed in claim 1, wherein the ESD detection circuit has a substrate resistor coupled between the bulk region and the first power rail.

3. The ESD protection circuit as claimed in claim 2, wherein the first MOS transistor is positioned on a well of a semiconductor substrate, and the substrate resistor represents the spread resistance of the well.

4. The ESD protection circuit as claimed in claim 1, wherein the first MOS transistor is a finger-type MOS transistor.

5. The ESD protection circuit as claimed in claim 1, wherein the gate is directly coupled to the first power.

6. The ESD protection circuit as claimed in claim 1, wherein the ESD protection circuit is applied in an output port, in which the first-MOS transistor acts as a current-driving MOS transistor.

7. The ESD protection circuit as claimed in claim 6, wherein the output port has a pre-driving circuit for driving the gate of the first MOS transistor.

8. The ESD protection circuit as claimed in claim 1, wherein the first conductive type is either N-type or P-type.

9. The ESD protection circuit as claimed in claim 1, wherein the ESD detection circuit comprises:
    a substrate resistor coupled between the bulk region and the first power rail;
    a second MOS transistor of a second conductive type for triggering the BJT, comprising:
        a source electrode coupled to the pad; and
        a drain electrode coupled to the bulk region of the first MOS transistor; and
    an RC circuit coupled between a second power rail and the first power rail which, during an ESD event, turns on the second MOS transistor.

10. The ESD protection circuit as claimed in claim 9, wherein the second MOS transistor has a bulk electrode coupled to the second power rail.

11. The ESD protection circuit as claimed in claim 9, wherein the RC circuit comprises:
    a detection resistor coupled between the gate electrode of the second MOS transistor and the second power rail; and
    a detection capacitor coupled between the gate electrode of the second MOS transistor and the first power rail.

12. The ESD protection circuit as claimed in claim 11, wherein the product of the capacitance of the detection capacitor and the resistance of the detection resistor is around the order of a microsecond.

13. The ESD protection circuit as claimed in claim 1, wherein the pad is employed in an input port.

14. The ESD protection circuit as claimed in claim 1, where the pad is coupled directly to a second power rail.

15. The ESD protection circuit as claimed in claim 14, wherein the ESD detection circuit comprises:
    an inverter powered by the first power rail and the second power rail, comprising an input node and an output node coupling to the bulk region; and
    an RC circuit coupled between a second power rail and the first power rail which, during an ESD event, switches the inverter to bias the bulk region thereby triggering the BJT.

16. The ESD protection circuit as claimed in claim 15, wherein the RC circuit comprises:
    a detection resistor coupled between the input node of the inverter and the second power rail; and
    a detection capacitor coupled between the input node of the inverter and the first power rail.

17. The ESD protection circuit as claimed in claim 15, wherein the ESD detection circuit further comprises a substrate resistor coupled between the bulk region and the first power rail.

18. An MOS transistor with enhanced ESD protection for an internal circuit powered by a first and second power rail, and receiving signals via a pad, comprising:
    a well region of a first conductive type;
    a control gate positioned on the well region; and
    a drain and a source regions of a second conductive type, positioned on the well region, adjacent to the control gate, and respectively coupled to the pad and the first power rail;
    a well contact region of the first conductive type, positioned on the well region and coupled to an ESD detection circuit;
    wherein the drain region, the well region and the source region construct a BJT;
    wherein, during an ESD event, the ESD detection circuit biases the well region thereby triggering the BJT to release an ESD current, and;

during normal operation, the ESD detection circuit couples the well region to the first power rail.

19. The MOS transistor as claimed in claim 18, wherein the MOS transistor further comprises a well-blocking region of the second conductive type where the well-blocking region overlays and couples with the source region.

20. The MOS transistor as claimed in claim 18, wherein the MOS transistor further comprises an isolation object positioned between the source region and the well contact region.

21. The MOS transistor as claimed in claim 18, wherein the well region is formed on a substrate of the first conductive type and coupled to the first power rail.

22. A method for improving ESD robustness of a MOS transistor, the MOS transistor comprising:
    a substrate coupled, during normal operation, to a first power rail;
    a gate isolated from the substrate;
    a source coupled to the first power rail; and
    a drain coupled to a pad;
    wherein the source, the substrate and the drain constitute a BJT; the method comprising:
        coupling the gate to the first power rail via a gate resistor;
        detecting an ESD event crossing the first power rail and the pad; and
        biasing, when the ESD event is detected, the substrate of the MOS transistor by a biasing current to trigger the BJT to release an ESD current.

23. The method as claimed in claim 22, further comprises a step of coupling the substrate to the first power rail via a substrate resistor to keep the BJT turn-off during normal operation, wherein the substrate resistor represents the spread resistance of a well region.

24. The method as claimed in claim 22, wherein the pad is employed in an input port.

25. The method as claimed in claim 22, wherein the pad is employed in an output port.

26. The method as claimed in claim 25, further comprises a step of driving the gate of the MOS transistor by a pre-driving circuit during normal operation.

27. The method as claimed in claim 22, further comprises a step of coupling the pad directly to a second power rail.

28. The method as claimed in claim 22, wherein the MOS transistor can be either an N-type MOS transistor or a P-type MOS transistor.

29. An electrostatic discharge (ESD) protection circuit for an internal circuit powered by a first and second power rail, and receiving signals via a pad, the ESD protection circuit comprising:
    a first MOS transistor of a first conductive type, comprising:
        a bulk region;
        a gate located on the bulk region;
        a source region coupled to the first power rail; and
        a drain region coupled to the pad;
        wherein the source region, the bulk region and the drain region construct a bipolar junction transistor (BJT); and
    an ESD detection circuit connected between the first power rail and the pad;
    wherein, during normal operation, the ESD detection circuit serves as the bulk region coupled to the first power rail, and, during an ESD event, the ESD detection circuit biases the bulk region to trigger the BJT thereby releasing ESD stress.

30. A method for improving ESD robustness of a MOS transistor for an internal circuit powered by a first and second power rail, and receiving signals via a pad, the MOS transistor comprising:
    a substrate coupled, during normal operation, to a first power rail;
    a gate isolated from the substrate;
    a source coupled to the first power rail; and
    a drain coupled to the pad;
    wherein the source, the substrate and the drain constitute a BJT;
    the method comprising:
        detecting an ESD event crossing the first power rail and the pad; and
        biasing, when the ESD event is detected, the substrate of the MOS transistor by a biasing current to trigger the BJT to release an ESD current.

* * * * *